(12) United States Patent
Chiu

(10) Patent No.: US 7,248,116 B2
(45) Date of Patent: Jul. 24, 2007

(54) DIFFERENTIAL AMPLIFIERS

(75) Inventor: Chinq-Shiun Chiu, Hsinchu (TW)

(73) Assignee: Mediatek, Inc., Hsin-Chu (TW)

( * ) Notice: Subject to any disclaimer, the term of this patent is extended or adjusted under 35 U.S.C. 154(b) by 115 days.

(21) Appl. No.: 11/264,213

(22) Filed: Nov. 1, 2005

(65) Prior Publication Data

US 2007/0096814 A1    May 3, 2007

(51) Int. Cl.
*H03F 3/45* (2006.01)
(52) U.S. Cl. .............................. 330/253; 330/69
(58) Field of Classification Search .................. 330/69, 330/98, 150, 253, 261, 310
See application file for complete search history.

(56) References Cited

U.S. PATENT DOCUMENTS

| | | | |
|---|---|---|---|
| 5,994,959 A | 11/1999 | Ainsworth | 330/252 |
| 6,188,280 B1 | 2/2001 | Filip | 330/252 |
| 6,366,140 B1 * | 4/2002 | Warwar | 327/108 |
| 6,828,855 B1 * | 12/2004 | Wang | 330/253 |
| 7,142,056 B2 * | 11/2006 | Blecker et al. | 330/253 |

* cited by examiner

*Primary Examiner*—Henry Choe
(74) *Attorney, Agent, or Firm*—Thomas, Kayden, Horstemeyer & Risley

(57) ABSTRACT

Differential amplifiers comprise a differential input stage, first, second, third, and fourth fixed current sources, a first resistive element, and a current-folding element. Due to topology thereof, the differential amplifier converts the difference between the input voltages to the voltage difference between the source voltages of the transistors in the differential pair, and a current is induced through the first resistive element, thereby generating two currents. The current-folding element folds the two currents to generate output voltages.

19 Claims, 5 Drawing Sheets

| m1 | m2 | m2/m1 | R2/R1 | total gain | total gain | 4 bit code | thermo code |
|---|---|---|---|---|---|---|---|
| 90 | 196 | 2.18 | 1 | 2.18 | 6.76 | (1111) | (1111,1111,1111,1111) |
| 90 | 194 | 2.16 | 1 | 2.16 | 6.67 | (1110) | (0111,1111,1111,1111) |
| 90 | 192 | 2.13 | 1 | 2.13 | 6.58 | (1101) | (0011,1111,1111,1111) |
| 90 | 190 | 2.11 | 1 | 2.11 | 6.49 | (1100) | (0001,1111,1111,1111) |
| 90 | 188 | 2.09 | 1 | 2.09 | 6.40 | (1011) | (0000,1111,1111,1111) |
| 90 | 186 | 2.07 | 1 | 2.07 | 6.31 | (1010) | (0000,0111,1111,1111) |
| 90 | 184 | 2.04 | 1 | 2.04 | 6.21 | (1001) | (0000,0011,1111,1111) |
| 90 | 182 | 2.02 | 1 | 2.02 | 6.12 | (1000) | (0000,0001,1111,1111) |
| 90 | 180 | 2.00 | 1 | 2.00 | 6.02 | (0111) | (0000,0000,1111,1111) |
| 90 | 178 | 1.98 | 1 | 1.98 | 5.92 | (0110) | (0000,0000,0111,1111) |
| 90 | 176 | 1.96 | 1 | 1.96 | 5.83 | (0101) | (0000,0000,0011,1111) |
| 90 | 174 | 1.93 | 1 | 1.93 | 5.73 | (0100) | (0000,0000,0001,1111) |
| 90 | 172 | 1.91 | 1 | 1.91 | 5.63 | (0011) | (0000,0000,0000,1111) |
| 90 | 170 | 1.89 | 1 | 1.89 | 5.52 | (0010) | (0000,0000,0000,0111) |
| 90 | 168 | 1.87 | 1 | 1.87 | 5.42 | (0001) | (0000,0000,0000,0011) |
| 90 | 166 | 1.84 | 1 | 1.84 | 5.32 | (0000) | (0000,0000,0000,0001) |

FIG. 3

| thermo code | sim(tt) I chanel | sim(ss) I chanel | sim(ff) I chanel |
|---|---|---|---|
| (1111,1111,1111,1111) | 6.7 | 6.45 | 6.93 |
| (0111,1111,1111,1111) | 6.62 | 6.38 | 6.84 |
| (0011,1111,1111,1111) | 6.54 | 6.31 | 6.76 |
| (0001,1111,1111,1111) | 6.46 | 6.23 | 6.68 |
| (0000,1111,1111,1111) | 6.38 | 6.16 | 6.59 |
| (0000,0111,1111,1111) | 6.3 | 6.08 | 6.5 |
| (0000,0011,1111,1111) | 6.21 | 6.01 | 6.42 |
| (0000,0001,1111,1111) | 6.13 | 5.93 | 6.33 |
| (0000,0000,1111,1111) | 6.04 | 5.85 | 6.24 |
| (0000,0000,0111,1111) | 5.95 | 5.77 | 6.15 |
| (0000,0000,0011,1111) | 5.86 | 5.68 | 6.05 |
| (0000,0000,0001,1111) | 5.77 | 5.6 | 5.96 |
| (0000,0000,0000,1111) | 5.68 | 5.51 | 5.87 |
| (0000,0000,0000,0111) | 5.59 | 5.43 | 5.77 |
| (0000,0000,0000,0011) | 5.5 | 5.34 | 5.67 |
| (0000,0000,0000,0001) | 5.4 | 5.25 | 5.57 |

FIG. 4

DIFFERENTIAL AMPLIFIERS

BACKGROUND

The invention relates to differential amplifiers, and more particularly, to differential amplifiers with a large and predictable linear gain over a wide input range.

Differential amplifiers are widely used in analog and digital circuits to amplify differential voltage between two input signals. Ideally, a differential amplifier amplifies only the difference between the input signals while rejecting common-mode input changes such as noise. Differential amplifiers have found important applications where signals are contaminated by noise. For example, digital signals transmitted over a long cable may pick up miscellaneous noise signals during the signal transmission. The differential amplifiers reject the noise signals while amplifying the digital signals, thereby leading to the recovery of the original signals.

Unfortunately, conventional differential amplifiers present several drawbacks. For example, fully differential amplifier circuits often suffer from limited linear operating ranges. As a result, the differential amplifier circuits can only receive a narrow range of input voltages to produce a linear output. If the input voltages venture outside of the narrow input voltage range, the differential amplifier circuits produce a non-linear output.

In addition, the gain of conventional differential amplifiers may vary in response to changes in temperature. This is because base-emitter voltages of individual transistors in the differential amplifiers are highly sensitive to temperature variation. Since base-emitter voltages affect the transconductance of a transistor, the gain of the differential amplifier may not be constant or linear when such temperature variation occurs. In such cases, the gain of the conventional differential amplifiers may not be predictable due to the temperature variations.

Furthermore, the conventional differential amplifiers may not provide sufficient gain for state of the art low current or low voltage applications. For example, such high speed analog or digital circuits often employ low currents and/or low voltages to speed operation of the circuit while reducing power requirements for continuously decreased die sizes. At such low currents and/or voltages, the conventional differential amplifiers may not provide enough gain to operate properly in high speed applications.

Thus, what is needed is a differential amplifier that provides a large and predictable linear gain over a wide input range.

SUMMARY

Embodiments of a differential amplifier are disclosed. The differential amplifier comprises a differential input stage, first, second, third, and fourth fixed current sources, a first resistive element, and a current-folding element. The differential input stage comprises a first transistor coupled between a first node and a second node, and a second transistor coupled between a third node and a fourth node, wherein control terminals of the first and second transistors receive an input signal. The first, second, third, and fourth fixed current sources are coupled between the first node and a first voltage source, between the third node and the first voltage source, between the second node and a second voltage source, and between the fourth node and the second voltage source respectively. The first resistive element is coupled between the second node and the fourth node. The current-folding element outputs an output signal and comprises a third transistor comprising a first terminal coupled to the first voltage source, a second terminal coupled to the second node and a control terminal coupled to the first node, and a fourth transistor comprising a first terminal coupled to the first voltage source, a second terminal coupled to the fourth node and a control terminal coupled to the third node.

The invention also discloses embodiments of a semiconductor circuit, comprising a differential input stage, first, second, third, and fourth fixed current sources, a first resistive element, and a current-folding element. The differential input stage comprises a first transistor coupled between a first node and a second node, and a second transistor coupled between a third node and a fourth node, wherein control terminals of the first and second transistors receive an input signal. The first, second, third, and fourth fixed current sources are coupled between the first node and a first voltage source, between the third node and the first voltage source, between the second node and a second voltage source, and between the fourth node and the second voltage source respectively. The first resistive element is coupled between the second node and the fourth node. The current-folding element outputs an output signal and comprises a third transistor comprising a first terminal coupled to the first voltage source, a second terminal coupled to the second node and a control terminal coupled to the first node; and a fourth transistor comprising a first terminal coupled to the first voltage source, a second terminal coupled to the fourth node and a control terminal coupled to the third node; a fifth transistor comprising a first terminal coupled to the first voltage source, a second terminal coupled to a fifth node and a control terminal coupled to the first node; and a sixth transistor comprising a first terminal coupled to the first voltage source, a second terminal coupled to a sixth node and a control terminal coupled to the third node, wherein the third to sixth transistors are substantially the same size.

DESCRIPTION OF THE DRAWINGS

The invention can be more fully understood by the subsequent detailed description and examples with reference made to the accompanying drawings, wherein:

FIG. 3 shows the relationship between gain of the differential amplifier and size between transistors in the current-folding element; and FIG. 4 shows simulation results of the differential amplifier under ss corner process, tt corner process and ff corner process.

DETAILED DESCRIPTION

In the following detailed description of the invention, differential amplifiers capable of providing a linear gain over a wide input range, numerous specific details are set forth in order to provide a thorough understanding of the invention. However, it will obvious to one skilled in the art that the invention may be practiced without theses specifically. In other instances, well known methods, procedures, components and circuits have not been described in detail so as to not unnecessarily obscure aspects of the invention.

Figure 1:
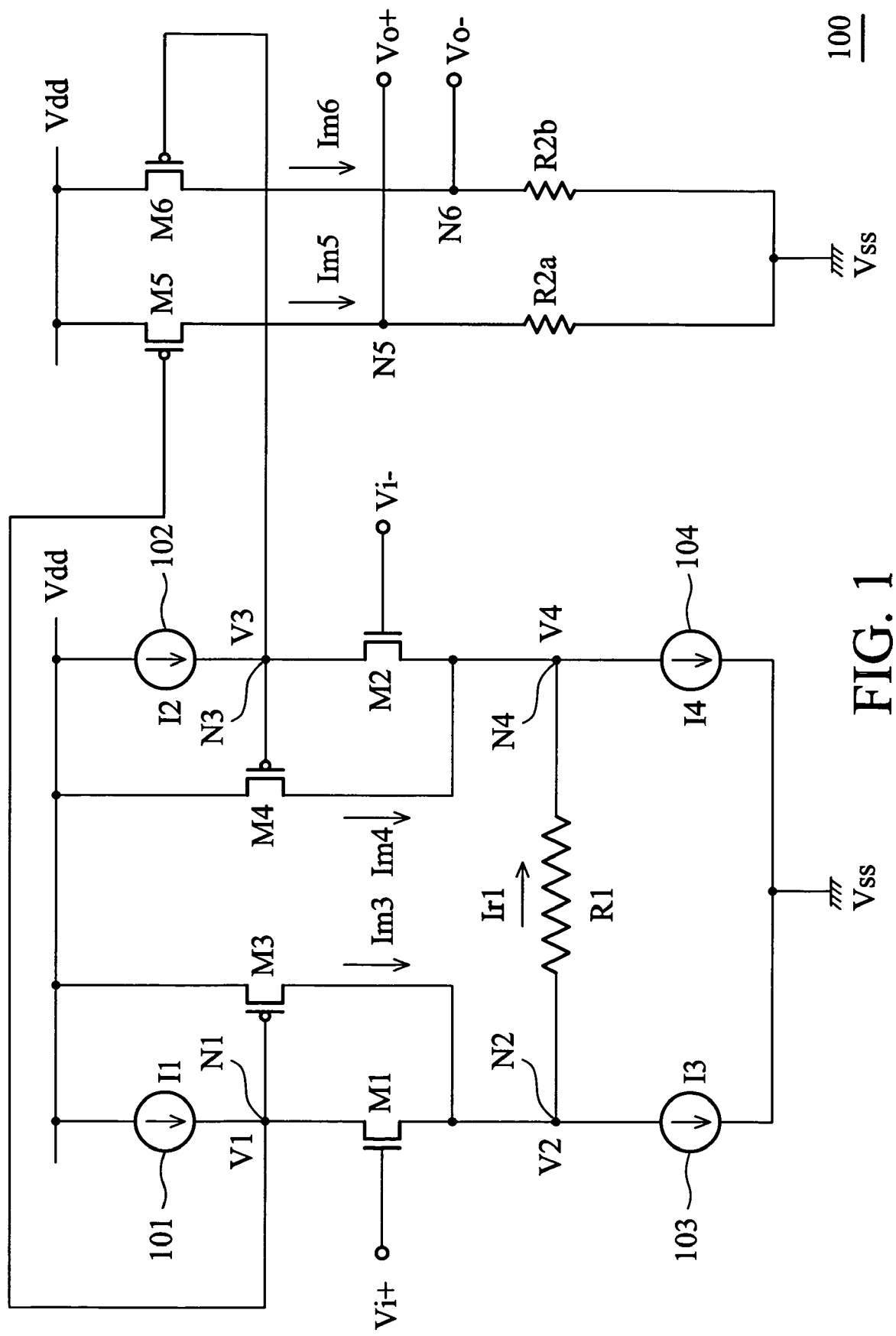
FIG. 1 shows an embodiment of a differential amplifier.

FIG. 1 shows an embodiment of a differential amplifier. The differential amplifier comprises a differential input stage, four fixed current sources 101-104, resistive elements R1, R2*a* and R2*b*, and a current-folding element. In the invention, the differential amplifier 100, due to topology thereof, converts the difference between the input voltages $V_{i+}$ and $V_{i-}$ to the voltage difference between the source voltages (nodes N2 and N4) of the transistors M1 and M2. Thus, a current Ir1 is induced through the resistor R1, such that currents Im3 and Im4 through the transistors M3 and M4 are adjusted accordingly. Because the sources of the transistors M3-M6 are coupled to a positive supply voltage Vdd and the gates of the transistors M3 and M5 are coupled together and the gates of the transistors M4 and M6 are coupled together, currents Im3 and Im4 through the transistors M3 and M4 are folded to the currents Im5 and Im6 through the transistors M5 and M6, linearly controlling gain of the differential amplifier 100. Operation and structure of the differential amplifier 100 are described as follows.

The differential input stage comprises a differential pair comprising transistors M1 and M2 and is configured to receive differential input voltages $V_{i+}$ and $V_{i-}$. The transistors M1 and M2 are preferably MOS transistors, each having a drain, a source and a gate. The transistors M1 and M2 receive the differential input voltages $V_{i+}$ and $V_{i-}$ across the gates. The drain and source of the transistor M1 and M2 are coupled to nodes N1 and N2 respectively, and the drain and source of the transistor M2 are coupled to nodes N3 and N4 respectively.

The resistive element R1 is coupled between the second node N2 and the fourth node N4. The resistive elements R2a and R2b are coupled between fifth node N5 and a negative supply voltage Vss and between sixth node N6 and the negative supply voltage Vss respectively. Preferably, the resistive elements R1, R2a and R2b are resistors formed by the same process and parameters, and the resistive elements R2a and R2b are matching resistors. For example, the resistive elements R2a and R2b may each have a resistance N times that of the resistive element R1, wherein N>1. In some examples, the resistors R1, R2a and R2b can comprise variable resistors.

The current-folding element comprises transistors M3-M6, and is configured to output voltages $V_{o+}$ and $V_{o-}$. The transistors M3-M6 are preferably MOS transistors, each having a drain, a source and a gate. The transistor M3 comprises a source terminal coupled to the positive supply voltage Vdd, a drain coupled to the second node N2 and a gate coupled to the first node N1. The transistor M4 comprises a source coupled to the positive supply voltage Vdd, a drain coupled to the fourth node N4 and a gate coupled to the third node N3. The transistor M5 comprises a source coupled to the positive supply voltage Vdd, a drain coupled to the fourth node N5 and a gate coupled to the first node N1. The transistor M6 comprises a source coupled to the positive supply voltage Vdd, a drain coupled to the sixth node N6 and a gate coupled to the third node N3.

The fixed current source 101 is coupled between the first node N1 and a positive supply voltage Vdd to limit current through the transistor M1 to I1. The fixed current source 102 is coupled between the third node N3 and the positive supply voltage Vdd to limit current through the transistor M2 to I2. The fixed current source 103 is coupled between the second node N2 and the negative supply voltage Vss to limit currents through the transistors M1 and M3 to I3 when there is no voltage difference between $V_{i+}$ and $V_{i-}$. The fixed current source 104 is coupled between the fourth node N4 and the negative supply voltage Vss to limit currents through the transistors M2 and M4 to I4 when there is no voltage difference between $V_{i+}$ and $V_{i-}$.

In accordance with a preferred embodiment, the differential amplifier 100 is configured to be symmetrical. Namely, the transistors M1 and M2 are matching transistors of substantially equal size, the transistors M3 and M4 are matching transistors of substantially equal size, and the transistors M5 and M6 are matching transistors of substantially equal size, wherein the transistors M5 and M6 are each K times the size of transistors M3 and M4, and K>1. The fixed current sources 101 and 102 are matching current sources such that currents I1 and I2 are the same. The fixed current sources 103 and 104 are matching current sources such that the currents I3 and I4 are the same, wherein currents I3 and I4 exceed the currents I1 and I2.

Because there is no current through the gate of the transistor M3, the current through the transistor M1 is limited at I1 by the fixed current source 101, and the sum of the current I1 and current Im3 through the transistor M3 is limited at I3 by the fixed current source 103 when there is no voltage difference between $V_{i+}$ and $V_{i-}$. Similarly, since there is no current through the gate of the transistor M4, current through the transistor M2 is limited at I2 by the fixed current source 103, and the sum of the current I2 and current Im4 through the transistor M4 is limited at I4 by the fixed current source 104 when there is no voltage difference between $V_{i+}$ and $V_{i-}$. In FIG. 1, the directions of Im3 and Im4 represented by arrows are merely examples. If Im3 flows in an opposite direction, the current Im3 would be a negative value. Similarly, if Im4 flows in an opposite direction, the current Im4 would be a negative value. Also, the current Ir1 can be a positive value (in the direction denoted by FIG. 1) or a negative value (in an opposite direction).

Due to current limitation by the fixed current sources 101-104, the voltage variation at the gates of the transistors M1 and M2 causes voltage variation at the drains thereof, based on the formula.

$$I = K\left(\frac{W}{L}\right)[Vgs - Vt]^2 ;$$

wherein K is a process parameter, W is channel width, L is channel length, Vgs is gate-source voltage of transistor, and Vt is threshold voltage of transistor.

For example, the source voltage V2 of the transistor M1 may lower to maintain current limited by the fixed current sources 101 and 103 when the gate voltage ($V_{i+}$) decreases. Source voltage V2 of the transistor M1 increases to maintain current limited by the fixed current sources 101 and 103 when the gate voltage ($V_{i+}$) is increased. Similarly, the source voltage V4 of the transistor M2 may lower to maintain current limited by the fixed current sources 102 and 104 when the gate voltage ($V_{i+}$) decreases. Source voltage V4 of the transistor M4 increases to maintain current limited by the fixed current sources 102 and 104 when the gate voltage ($V_{i+}$) is increased.

Thus, voltages V2 and V4 at nodes N2 and N4 can be adjusted according to the input voltages $V_{i+}$ and $V_{i-}$ respectively, and the voltages V2 and V4, respectively, are:

$$V2 = V_{i+} - Vgs1; \text{ and}$$

$$V4 = V_{i-} - Vgs2;$$

wherein Vgs1 is the gate-source voltage of the transistor M1 and the Vgs2 is the gate-source voltage of the transistor M2.

Because the transistors M1 and M2 are matching transistors, Vgs1=Vgs2, and thus, input voltage difference of the differential input voltages $V_{i+}$ and $V_{i-}$ is:

$$V_{i+} - V_{i-} = V2 - V4;$$

$$V2 - V4 = Ir1 \times R1;\text{ and}$$

$$V_{i+} - V_{i-} = Ir1 \times R1.$$

Namely, voltage difference in the differential input voltages $V_{i+}$ and $V_{i-}$ causes current Ir1 through the resistor R1.

Due to current limitation of the fixed current sources 101-104, the currents Im3 and Im4 are adjusted by the current Ir1 through the resistor R1.

For example, current Ir1 can reach node N4 from the node N2 when voltage V2 exceeds voltage V4, and current Im3 increases and current Im4 decreases. Alternately, current Ir1 can reach node N2 from node N4 when voltage V4 exceeds voltage V2, and current Im4 increases and current Im3 decreases. The difference between (Im3+I3) and I3 is the current Ir1, and the sum of Ir1, Im4, and I2 is the current I4 provided by the current source I4. Further, current Ir1 through the resistor R1 is half of the difference between currents Im3 and Im4.

Because currents Im3 and Im4 vary with current Ir1, gate voltages of the transistors M3 and M4 are adjusted based on the formula.

$$I = K\left(\frac{W}{L}\right)[Vgs - Vt]^2;$$

wherein K is a process parameter, W is channel width, L is channel length, Vgs is gate-source voltage of transistor, and Vt is threshold voltage of transistor.

For example, because the source of the transistor M3 is electrically coupled to the positive supply voltage Vdd, the gate voltage (V1) of the transistor M3 increases to provide current Im3 when current Im3 increases. Because the source of the transistor M4 is electrically coupled to the positive supply voltage Vdd, the gate voltage (V3) of the transistor M4 decreases to provide current Im4 when current Im4 decreases. On the contrary, the gate voltage (V1) of the transistor M3 decreases to provide current Im3 when current Im3 decreases, and the gate voltage (V3) of the transistor M4 increases to provide current Im4 when current Im4 increases.

In this embodiment, sources of transistors M3-M6 are coupled to the positive supply voltage Vdd, the gates of the transistors M3 and M5 are coupled to the node N1, and the gates of the transistors M4 and M6 are coupled to the node N3. Because the transistors M5 and M6 match, is X times the size of the transistors M3 and M4, the currents Im5 and Im6, respectively, are:

$$Im5 = X Im3;\text{ and}$$

$$Im6 = X Im4.$$

Thus, the output voltages $V_{o+}$ and $V_{o-}$ at the nodes N5 and N6, respectively, are:

$$V_{o+} = Im5 \times R2a$$
$$= X Im3 \times R2a;\text{ and}$$
$$V_{o-} = Im6 \times R2b$$
$$= X Im4 \times R2a.$$

Accordingly, voltage difference of the output voltages $V_{o+}$ and $V_{o-}$ is:

$$V_{o+} - V_{o-} = Im5 \times R2a - Im6 \times R2b;$$
$$= R2a \times X(Im3 - Im4);$$

wherein resistances of the resistors R2a and R2b are the same and can be regarded as R2, because the resistive elements R2a and R2b match.

Thus, gain of the differential amplifier 100 is:

$$\text{gain} = \frac{Vout}{Vin}$$
$$= \frac{V_{o+} - V_{o-}}{V_{i+} - V_{i-}}$$
$$= \frac{R2 \times X(Im3 - Im4)}{Ir1 \times R1}$$

Because current Ir1 through the resistor R1 can be regarded as half of the difference between currents Im3 and Im4 through the transistors M3 and m4, the gain of the differential amplifier 100 is $$\text{gain} = \frac{R2 \times X(Im3 - Im4)}{\frac{1}{2}(Im3 - Im4) \times R1}$$
$$= 2X\frac{R2}{R1}$$

Thus, the gain of differential amplifier 100 relates the size between the resistors R1, R2a and R2b and that between the transistors M3 (M4) and M5 (M6) without threshold voltage of the transistors M1-M6 and process variations. Moreover, if the transistors M5 and M6 match the transistors M3 and M4 (X=1), gain is dependent on only resistance values. Namely, the differential amplifier 100 can be controlled linearly and accurately.

Figure 2A:
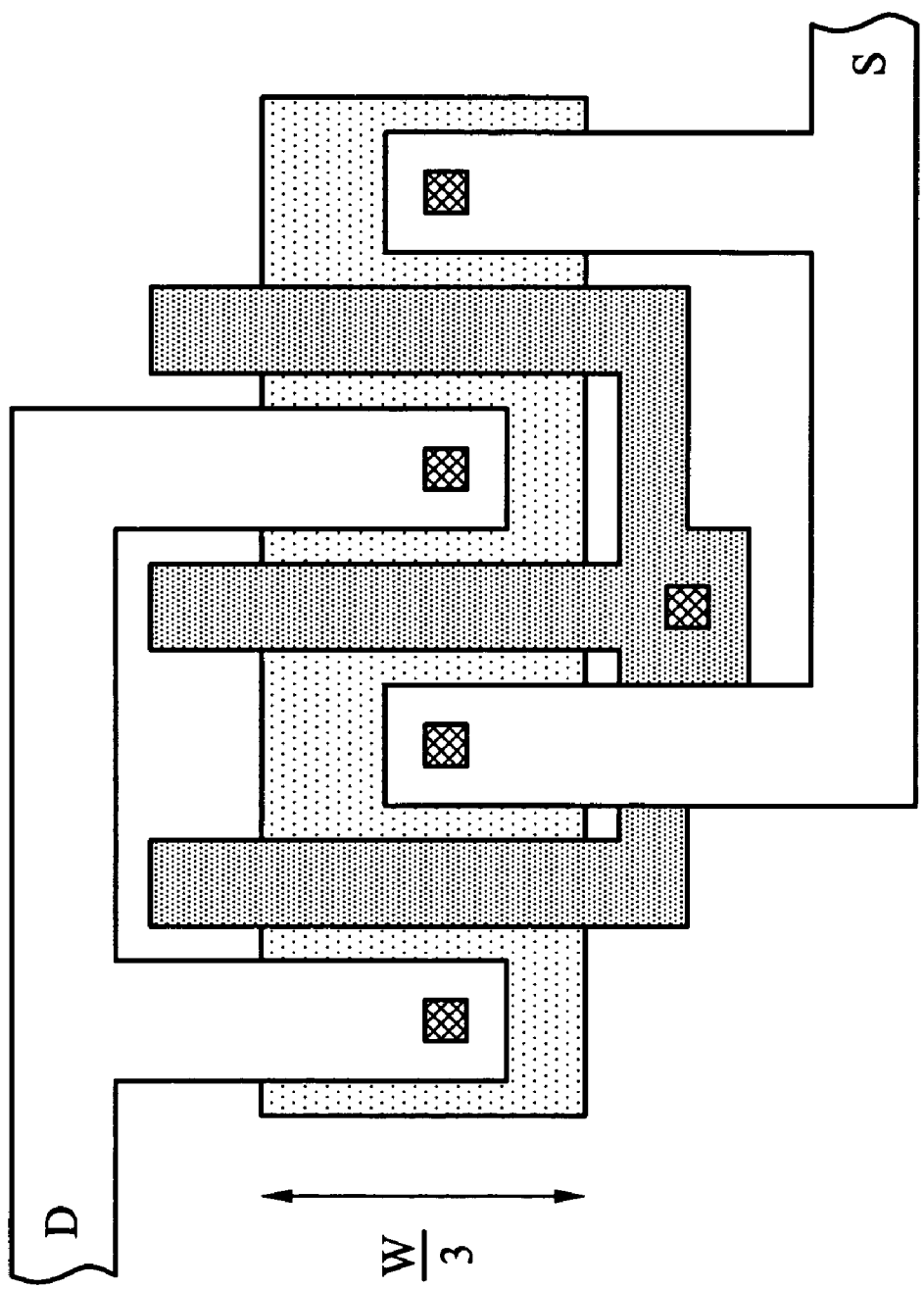
FIGS. 2*a* and 2*b* show embodiments of MOS transistors implemented with multiple fingers.
Figure 2B:
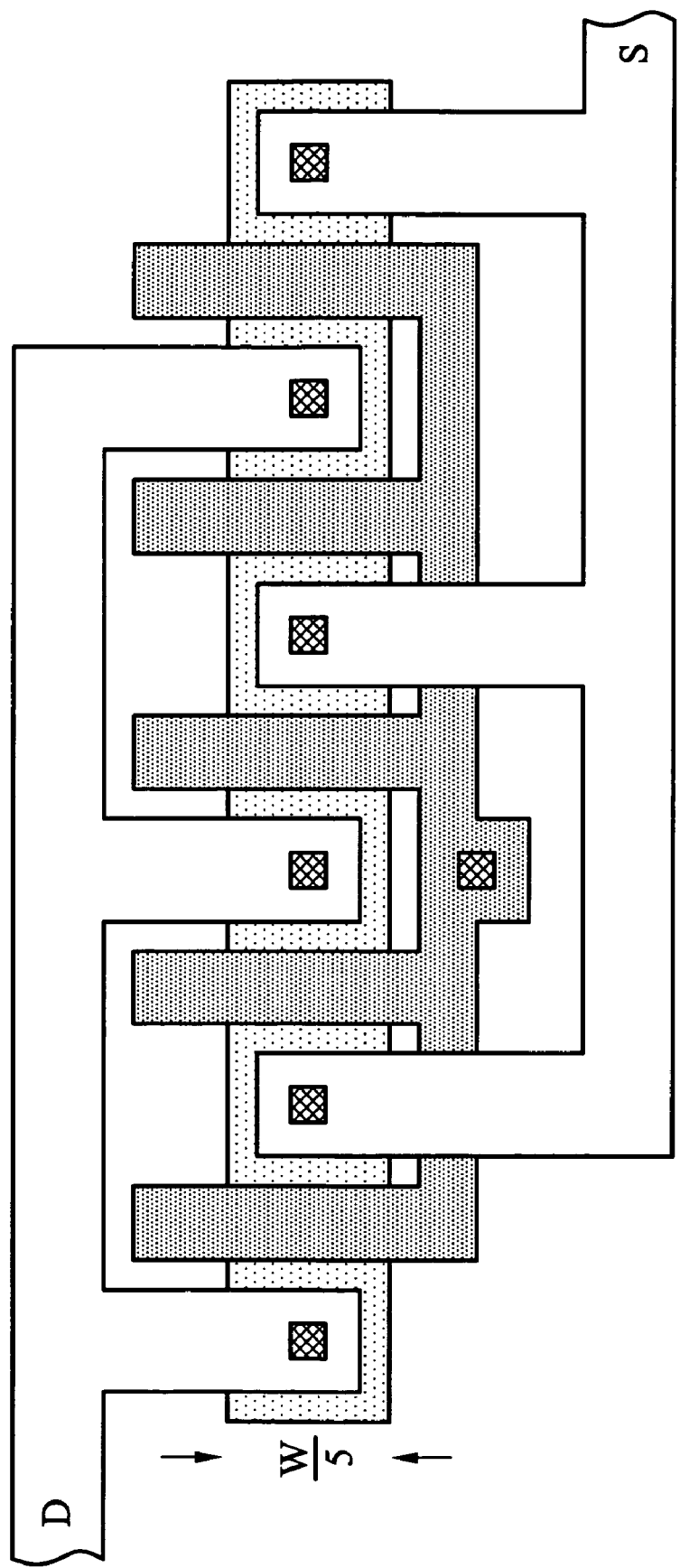

In the invention, the transistors M1-M6 can also be BJT transistors and preferably MOS transistors. Typically, MOS transistors can be implemented with multiple fingers, as shown in FIGS. 2a and 2b. For example, transistors M3 and M4 can each have 90 fingers, and transistors M5 and M6 each have 180 fingers if they are twice the size of transistors M3 and M4.

FIG. 3 shows the relationship between gain of the differential amplifier and size between the transistors in the current-folding element. FIG. 4 shows the simulation results of the differential amplifier under ss corner process, tt corner process and ff corner process. In this case, the resistors R1 and R2 are the same, m1 is the number of fingers of the transistors M3 and M4, and m2 is the number of fingers of the transistors M5 and M6 and can be tuned by 4 bit codes or thermo codes. As shown, gain of the differential amplifier 100 can be controlled by adjusting the number of fingers of the transistors M5 and M6, m2. For example, m2 is 180 and gain is 6.02 dB when the 4 bit code is 0111, m2 is 182 and gain is 6.12 dB when the 4 bit code is 1000, m2 is 184 and gain is 6.21 dB when the 4 bit code is 1001, and so on. Namely, as m2 is increased by two fingers according to the 4 bit codes, the gain is increased about 0.1 dB step by step. Alternately, m2 is 178 and gain is 5.92 dB when the 4 bit code is 0110, m2 is 176 and gain is 5.83 dB when the 4 bit code is 0101, m2 is 174 and gain is 5.73 dB when the 4 bit code is 0100, and so on. Namely, as m2 is decreased by two fingers according to the 4 bit codes, the gain is increased about 0.1 dB step by step. Thus, gain of the differential amplifier 100 can be controlled linearly and accurately by adjusting the number of fingers of the transistors M5 and M6 according to the 4 bit codes.

The 4 bit codes can also be converted to corresponding thermo codes to adjust the number of fingers of the transistors M5 and M6, and thus, gain of the differential amplifier 100 can be controlled linearly and accurately by adjusting the number of fingers of the transistors M5 and M6 according to the thermo codes.

Because the gain is dependent on only the size between the resistors and the size between the transistors, the invention can tune the gain of the differential amplifier finely by adjusting size (fingers) of the transistors according to 4 bit codes or thermo codes, or tune the gain thereof greatly by adjusted the resistance difference between the resistors R2 and R1. Thus, the differential amplifier can achieve a high linearity and accurate gain control.

Because there is no transistor or diode disposed between the transistor M5/M6 and the positive supply voltage Vdd or between the resistor R2a/R2b and the negative supply voltage Vss, the differential amplifier of the invention can achieve a dynamic range of output voltage between Vdd-Vt and Vss. As dynamic range of output voltage increases, the differential amplifiers can receive a broad range of input voltages $V_{i+}$ and $V_{i-}$ to produce a linear output. Namely, the differential amplifier can provide a large and predictable linear gain over a wide input range.

Furthermore, the differential amplifier 100 of the invention also can serve as a buffer due to high linearity, large dynamic range of output voltage and wide input range thereof. As the differential amplifier 100 serves as a buffer, operation and structure are similar to those disclosed, with the exception that the transistors M3-M6 are required to be the same size and gain thereof is 1.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A differential amplifier, comprising:
   a differential input stage comprising a first transistor coupled between a first node and a second node, and a second transistor coupled between a third node and a fourth node, wherein control terminals of the first and second transistors receive an input signal;
   first, second, third, and fourth fixed current sources coupled between the first node and a first voltage source, between the third node and the first voltage source, between the second node and a second voltage source, and between the fourth node and the second voltage source respectively;
   a first resistive element coupled between the second node and the fourth node; and
   a current-folding element outputting an output signal and comprising:
   a third transistor comprising a first terminal coupled to the first voltage source, a second terminal coupled to the second node and a control terminal coupled to the first node;
   a fourth transistor comprising a first terminal coupled to the first voltage source, a second terminal coupled to the fourth node and a control terminal coupled to the third node;
   a fifth transistor comprising a first terminal coupled to the first voltage source, a second terminal coupled to a fifth node and a control terminal coupled to the first node; and
   a sixth transistor comprising a first terminal coupled to the first voltage source, a second terminal coupled to a sixth node and a control terminal coupled to the third node.

2. The differential amplifier as claimed in claim 1, further comprising a second resistive element coupled between the fifth node, the sixth node and the second voltage source.

3. The differential amplifier as claimed in claim 1, wherein the first to sixth transistors are MOS transistors.

4. The differential amplifier as claimed in claim 1, wherein the first and second transistors are NMOS transistors, and the third to sixth transistors are PMOS transistors.

5. The differential amplifier as claimed in claim 1, wherein the first to sixth transistors are BJT transistors.

6. The differential amplifier as claimed in claim 1, wherein the fifth and sixth transistors comprise a predetermined size exceeding that of the third and fourth transistors, and gain of differential amplifier is adjusted by modifying a size ratio between the fifth transistor and the third transistor.

7. The differential amplifier as claimed in claim 1, wherein the fifth and sixth transistors each comprise a first predetermined number of fingers, the third and fourth transistors each comprise a second predetermined number of fingers, and gain of differential amplifier is adjusted by modifying the first and second predetermined numbers of fingers.

8. The differential amplifier as claimed in claim 2, wherein the first and second resistive elements comprise variable resistors.

9. The differential amplifier as claimed in claim 2, wherein a first voltage difference is generated between the second node and the fourth node by the input stage according to the input signal, generating a first current through the first resistive element.

10. The differential amplifier as claimed in claim 9, wherein a second voltage difference is generated between the first node and the third node according to the first current, such that a second current is generated by the fifth and sixth transistors to the second resistive element to generate the output signal.

11. A semiconductor circuit, comprising:
    a differential input stage comprising a first transistor coupled between a first node and a second node, and a second transistor coupled between a third node and a fourth node, wherein control terminals of the first and second transistors receive an input signal;
    first, second, third, and fourth fixed current sources coupled between the first node and a first voltage source, between the third node and the first voltage source, between the second node and a second voltage source, and between the fourth node and the second voltage source respectively;
    a first resistive element coupled between the second node and the fourth node; and a current-folding element outputting an output signal and comprising:
- a third transistor comprising a first terminal coupled to the first voltage source, a second terminal coupled to the second node and a control terminal coupled to the first node;
- a fourth transistor comprising a first terminal coupled to the first voltage source, a second terminal coupled to the fourth node and a control terminal coupled to the third node;
- a fifth transistor comprising a first terminal coupled to the first voltage source, a second terminal coupled to a fifth node and a control terminal coupled to the first node; and
- a sixth transistor comprising a first terminal coupled to the first voltage source, a second terminal coupled to a sixth node and a control terminal coupled to the third node, wherein the third to sixth transistors are substantially the same size.

12. The semiconductor circuit as claimed in claim 11, wherein the semiconductor circuit is a buffer circuit.

13. The semiconductor circuit as claimed in claim 11, further comprising a second resistive element coupled between the fifth node, the sixth node, and the second voltage source.

14. The semiconductor circuit as claimed in claim 11, wherein the first to sixth transistors are MOS transistors.

15. The semiconductor circuit as claimed in claim 11, wherein the first and second transistors are NMOS transistors, and the third to sixth transistors are PMOS transistors.

16. The semiconductor circuit as claimed in claim 11, wherein the first to sixth transistors are BJT transistors.

17. The semiconductor circuit as claimed in claim 13, wherein the first and second resistive elements comprise variable resistors.

18. The semiconductor circuit as claimed in claim 13, wherein a first voltage difference is generated between the second node and the fourth node by the input stage according to the input signal, generating a first current through the first resistive element.

19. The semiconductor circuit as claimed in claim 18, wherein a second voltage difference is generated between the first node and the third node according to the first current, such that a second current is generated by the fifth and sixth transistors to the second resistive element to generate the output signal.

* * * * *